US009893258B2

(12) United States Patent
Abe et al.

(10) Patent No.: US 9,893,258 B2
(45) Date of Patent: Feb. 13, 2018

(54) PACKAGE, LIGHT EMITTING DEVICE, AND METHODS OF MANUFACTURING THE PACKAGE AND THE LIGHT EMITTING DEVICE

(71) Applicant: NICHIA CORPORATION, Anan-shi, Tokushima (JP)

(72) Inventors: Koji Abe, Tokushima (JP); Yuki Shiota, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/437,997

(22) Filed: Feb. 21, 2017

(65) Prior Publication Data

US 2017/0162770 A1 Jun. 8, 2017

Related U.S. Application Data

(62) Division of application No. 14/978,641, filed on Dec. 22, 2015, now Pat. No. 9,614,138.

(30) Foreign Application Priority Data

Dec. 25, 2014 (JP) ................................. 2014-263694

(51) Int. Cl.
*H01L 21/00* (2006.01)
*H01L 33/62* (2010.01)
(Continued)

(52) U.S. Cl.
CPC .......... *H01L 33/62* (2013.01); *H01L 21/4846* (2013.01); *H01L 21/565* (2013.01);
(Continued)

(58) Field of Classification Search
CPC ........ H01L 33/62; H01L 33/52; H01L 21/565
(Continued)

(56) References Cited

U.S. PATENT DOCUMENTS

2005/0280017 A1 12/2005 Oshio et al.
2007/0030703 A1 2/2007 Lee et al.
(Continued)

FOREIGN PATENT DOCUMENTS

JP    H07-153892 A    6/1995
JP    2005-353914 A    12/2005
(Continued)

OTHER PUBLICATIONS

Notice of Allowance issued in U.S. Appl. No. 14/978,641 dated Nov. 23, 2016.

*Primary Examiner* — Anthony Ho
(74) *Attorney, Agent, or Firm* — Foley & Lardner LLP

(57) ABSTRACT

A package for mounting a light emitting element includes a recess; a pair of lead electrodes exposed at a bottom surface of the recess; a plating layer covering a surface of each of the pair of lead electrodes; and a resin molded body retaining the pair of lead electrodes, and forming an area between the pair of lead electrodes at the bottom surface of the recess and a lateral surface of the recess. At least one of the lead electrodes has a front surface protrusion that is linearly formed along the resin molded body at the bottom surface of the recess and along a periphery of the bottom surface of the recess, and a back surface protrusion that is formed at a position at a back surface opposite to a position of the front surface protrusion, and at least a tip of each of the front surface protrusion and the back surface protrusion is exposed outside the plating layer.

18 Claims, 12 Drawing Sheets

(51) Int. Cl.
    *H01L 21/48*     (2006.01)
    *H01L 21/56*     (2006.01)
    *H01L 33/52*     (2010.01)
    *H01L 33/48*     (2010.01)

(52) U.S. Cl.
    CPC ............ *H01L 33/486* (2013.01); *H01L 33/52* (2013.01); *H01L 2933/005* (2013.01); *H01L 2933/0066* (2013.01)

(58) Field of Classification Search
    USPC .......................................................... 438/26
    See application file for complete search history.

(56) References Cited

U.S. PATENT DOCUMENTS

| | | |
|---|---|---|
| 2011/0031525 A1 | 2/2011 | Nemoto et al. |
| 2012/0001311 A1 | 1/2012 | Nishino et al. |
| 2016/0190399 A1 | 6/2016 | Abe et al. |

FOREIGN PATENT DOCUMENTS

| | | |
|---|---|---|
| JP | 2008-177496 A | 7/2008 |
| JP | 2011-035306 A | 2/2011 |
| JP | 2011-101053 A | 5/2011 |
| JP | 2012-028744 A | 2/2012 |
| JP | 2012-146816 A | 8/2012 |
| JP | 2014-029995 A | 2/2014 |
| JP | 2014-140073 A | 7/2014 |
| JP | 2015-041683 A | 3/2015 |

PACKAGE, LIGHT EMITTING DEVICE, AND METHODS OF MANUFACTURING THE PACKAGE AND THE LIGHT EMITTING DEVICE

CROSS-REFERENCE TO RELATED APPLICATIONS

This application is a divisional of U.S. patent application Ser. No. 14/978,641, filed on Dec. 22, 2015, which claims priority to Japanese Patent Application No. 2014-263694, filed on Dec. 25, 2014, the disclosures of which are hereby incorporated by reference in their entireties.

BACKGROUND

1. Technical Field

The present disclosure relates to a package, a light emitting device, and methods of manufacturing the package and the light emitting device.

2. Description of the Related Art

A method of manufacturing a light emitting diode (hereinafter referred to as an "LED") includes molding a package, and an LED is manufactured through the molding step. In manufacturing an LED, transfer molding has been typically employed, in which a lead frame is set in a mold and liquid resin is injected. However, with such a method of manufacturing an LED, the resin flows into a gap between the lead frame and the mold, which may result in generation of resin burrs. Such resin burrs may cause a bonding failure of LED elements and/or wires, so the burrs must be removed. Accordingly, in conventional manufacturing of an LED, the molding is always followed by removing the burrs.

In such a method of manufacturing an LED, examples of ways to prevent generation of resin burrs include optimizing conditions in the molding, increasing the pressing force of the mold, reducing the number of LEDs molded with a single lead frame, increasing the viscosity of resin to reduce flowability or the like.

Further, JP 2014-29995 A discloses that, in a lead frame provided with a plating layer on its surface, burrs can be reduced by allowing the plating layer to rise and protrude at the border of a portion where a metal portion is desired to be exposed (an LED mounting portion, a wire bonding portion), or by allowing part of the lead frame body to rise and providing plating thereon to protrude.

The mold disclosed in JP 2014-29995 A is provided with a projection having a shape corresponding to a recess of a package. Accordingly, the mold has the following structure. When the lead frame is pressed, the projection of the mold abuts and is pressed against the plating raised at the border of the LED mounting portion, or a protrusion where the lead frame itself is raised and provided with plating. Thus, entry of resin which will become burrs is prevented.

However, according to the method of manufacturing disclosed in JP 2014-29995 A, in the case where the protrusion is formed by raising the plating layer, the protrusion may be crushed by the mold at the time of pressing the mold, and the mold may also be brought into contact with the LED mounting portion. This contact results in formation of a mark in the LED mounting portion that reduces the glossiness of the plating, which may lead to a reduction in the output of the LED.

SUMMARY

The embodiments of the present disclosure provide a package and a light emitting device in which the generation of burrs is suppressed, and methods of manufacturing the package and the light emitting device while suppressing the generation of burrs.

A package for mounting a light emitting element according to certain embodiments of the present disclosure includes a recess, a pair of lead electrodes exposed at a bottom surface of the recess, a plating layer covering a surface of each of the pair of lead electrodes, and a resin molded body that holds the pair of lead electrodes and is exposed between the pair of lead electrodes at the bottom surface of the recess and forms a lateral surface of the recess. At least one of the pair of lead electrodes has a front surface protrusion that is a protrusion linearly formed along the resin molded body at the bottom surface of the recess and along a periphery of the bottom surface of the recess, and a back surface protrusion that is a protrusion formed at a position at a back surface opposite to a position of the front surface protrusion. At least a tip of each of the front surface protrusion and the back surface protrusion is exposed outside the plating layer.

Further, a package for mounting a light emitting element according to certain embodiments of the present disclosure includes a recess, a pair of lead electrodes exposed at a bottom surface of the recess, a plating layer covering a surface of each of the pair of lead electrodes, and a resin molded body that holds the pair of lead electrodes and is exposed between the pair of lead electrodes at the bottom surface of the recess and forms a lateral surface of the recess. At least one of the pair of lead electrodes has a front surface protrusion that is a protrusion linearly formed along the resin molded body at the bottom surface of the recess and along a periphery of the bottom surface of the recess, and a back surface protrusion that is a protrusion formed at a position at a back surface opposite to a position of the front surface protrusion. The front surface protrusion may have a width of 110 μm or more.

Still further, a light emitting device according to certain embodiments of the present disclosure includes the package, and a light emitting element accommodated in the recess of the package and mounted on one of the pair of lead electrodes.

Still further, a method of manufacturing a package for mounting a light emitting element according to certain embodiments of the present disclosure includes, providing a pair of lead electrodes, each made of a metal plate, the metal plate of at least one of the pair of lead electrodes being processed to have a front surface protrusion and a back surface protrusion, the front surface protrusion being formed in a circular shape to surround a region for mounting a light emitting element, and a back surface protrusion being formed at a position at a back surface of the metal plate opposite to a position of the front surface protrusion; forming a plating layer on a surface of each of the pair of lead electrodes such that at least a tip of each of the front surface protrusion and the back surface protrusion is exposed; forming a package that defines a recess by the pair of lead electrodes and a resin molded body, the forming including using a mold having an upper mold part having a projection having a shape corresponding to the recess and a lower mold part on which the first lead electrode and the second lead electrode are to be placed; placing the first lead electrode and the second lead electrode in predetermined positions on the lower mold part so that the first lead electrode and the second lead electrode are set between the upper mold part and the lower mold part and that the exposed tip of the front surface protrusion abuts the upper mold part and the exposed tip of the back surface protrusion abuts the lower mold part;

pressing the upper mold part against the pair of lead electrodes; injecting a resin into the mold that is in contact with the pair of lead electrodes; curing the injected resin to harden the resin molded body; and removing the upper mold part from the lower mold part.

Still further, a method of manufacturing a package for mounting a light emitting element according to certain embodiments of present disclosure includes, providing a pair of lead electrodes, each made of a metal plate, the metal plate of at least one of the pair of lead electrodes being processed to have a front surface protrusion and a back surface protrusion, the front surface protrusion being formed in a circular shape to surround a region for mounting a light emitting element, and a back surface protrusion being formed at a position at a back surface of the metal plate opposite to a position of the front surface protrusion; forming a plating layer on a surface of each of the pair of lead electrodes; forming a package that defines a recess by the pair of lead electrodes and a resin molded body, the forming including using a mold having an upper mold part having a projection having a shape corresponding to the recess and a lower mold part on which the first lead electrode and the second lead electrode are to be placed; placing the first lead electrode and the second lead electrode in predetermined positions on the lower mold part so that the first lead electrode and the second lead electrode are set between the upper mold part and the lower mold part and that the exposed tip of the front surface protrusion abuts the upper mold part and the exposed tip of the back surface protrusion abuts the lower mold part; pressing the upper mold part against the pair of lead electrodes; injecting a resin into the mold that is in contact with the pair of lead electrodes; curing the injected resin to harden the resin molded body; and removing the upper mold part from the lower mold part.

Still further, a method of manufacturing a light emitting device according to certain embodiments of the present disclosure includes, manufacturing a package according to the method of manufacturing a package described in the embodiments of the present disclosure, and mounting a light emitting element on the recess formed in the package.

With the package and the light emitting device according to the embodiments of the present disclosure, production of burrs can be suppressed without reducing the output of an LED. Further, according to the methods of manufacturing a package and a light emitting device of the present disclosure, a package and a light emitting device in which production of burrs is suppressed without reducing the output of an LED can be manufactured.

DETAILED DESCRIPTION OF EMBODIMENTS

Embodiments

Figure 1:
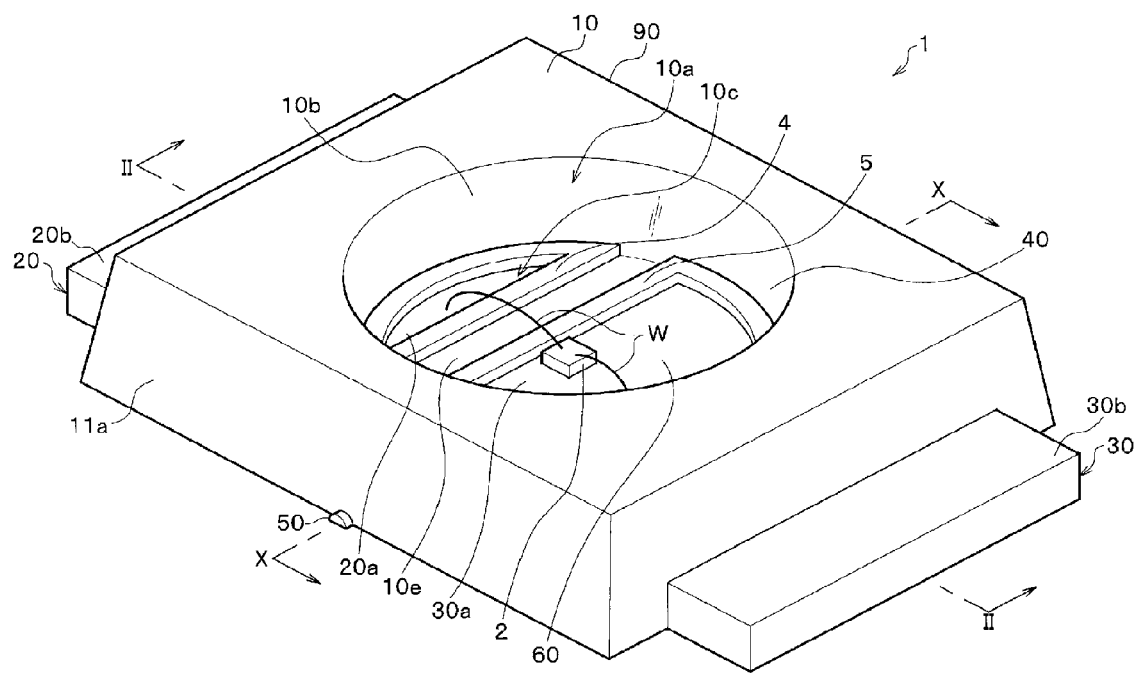
FIG. 1 is a schematic diagram of a cross section of a light emitting device according to one embodiment.

In the following, embodiments will be described with reference to the drawings. Each of the embodiments shown below exemplifies a light emitting device embodying the technical idea of the present invention; the technical idea of the present invention is not limited to the embodiments shown below. Further, the size, material, shape, relative arrangement and the like of constituent components described in the embodiments are not intended to limit the scope of the present invention thereto unless otherwise specified, and they are merely examples. Note that, the size, positional relationship and the like in the drawings may be exaggerated for the sake of clarity.

Figure 2:
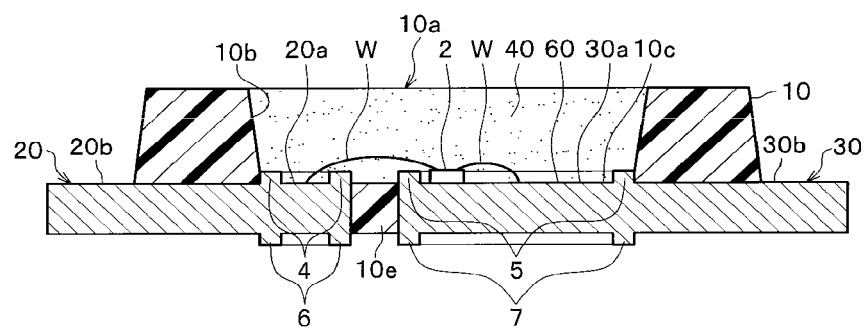
FIG. 2 is a schematic diagram of a cross section of the light emitting device according to one embodiment taken along line II-II in FIG. 1.
Figure 3:
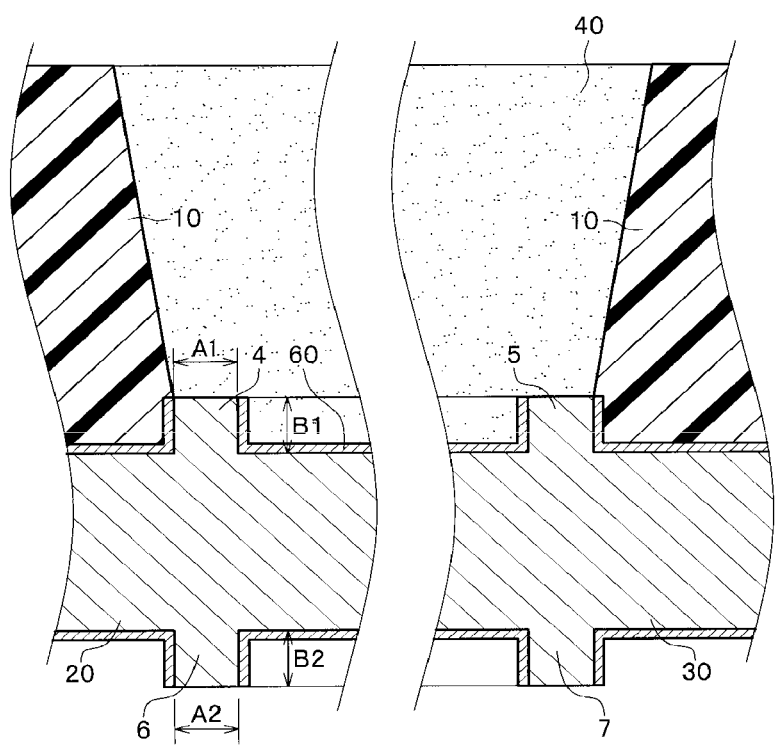
FIG. 3 is a partial schematic diagram of a cross-section of the light emitting device according to one embodiment, showing a state of a plating layer.
Figure 4:
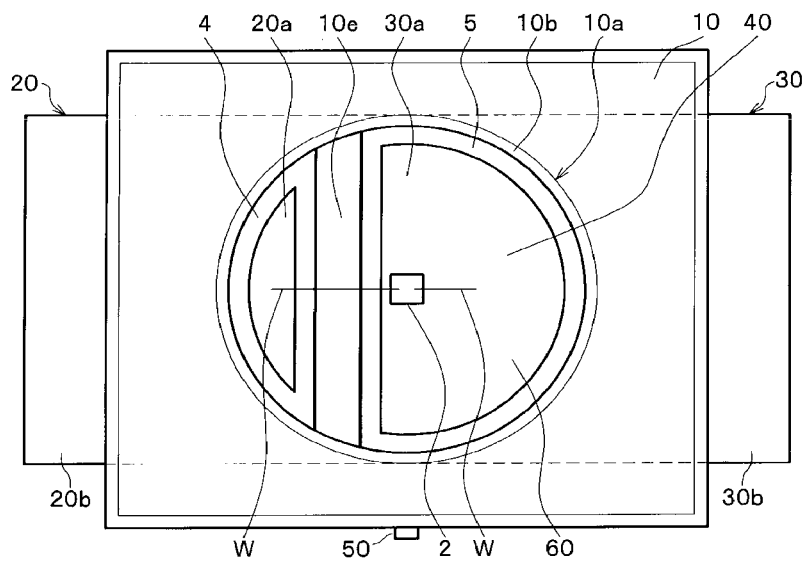
FIG. 4 is a schematic diagram of a top view of the light emitting device according to one embodiment.
Figure 5:
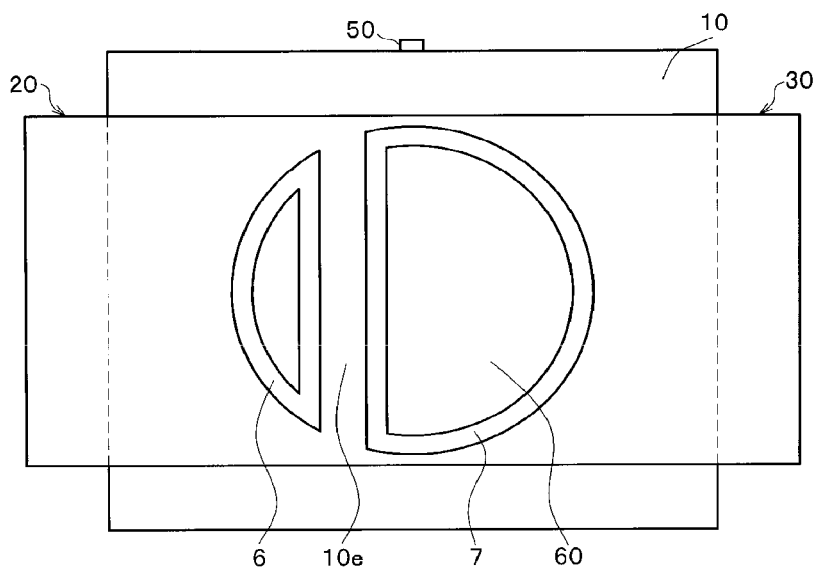
FIG. 5 is a schematic diagram of a bottom view of the light emitting device according to one embodiment.

FIG. 1 is a schematic diagram of a cross section of a light emitting device according to one embodiment. FIG. 2 is a schematic diagram of a cross section of the light emitting device according to one embodiment taken along line II-II in FIG. 1. FIG. 3 is a partial schematic diagram of a cross-section of the light emitting device according to one embodiment, showing a state of a plating layer. FIG. 4 is a schematic diagram of a top view of the light emitting device according to one embodiment. FIG. 5 is a schematic diagram of a bottom view of the light emitting device according to one embodiment.

A light emitting device 1 includes a package 90, a light emitting element 2, wires W, and a sealing member 40.

The package 90 includes pair of lead electrodes 20 and 30 made of metal plates, a plating layer 60 covering the surface of the pair of lead electrodes 20 and 30, and a resin molded body 10. The package 90 is provided with a recess 10a for storing the light emitting element 2. The pair of lead electrodes 20 and 30 are exposed at a bottom surface 10c of the recess 10a.

The shape of the whole package 90 is approximately a rectangular parallelepiped. At the upper surface of the package 90, the cup-shaped recess (a cavity) 10a for storing the light emitting element 2 is formed. The package 90 is integrally retained by the resin molded body 10 such that the pair of lead electrodes 20 and 30 made of metal plates are exposed outside the resin molded body 10 and at the bottom surface 10c of the recess 10a.

The resin molded body 10 forms the area between the first lead electrode 20 and the second lead electrode 30 at the bottom surface 10c of the recess 10a and a lateral surface 10b of the recess 10a, and retains the pair of lead electrodes 20 and 30. Thus, the resin molded body 10 fixes the first lead electrode 20 and the second lead electrode 30. Further, the resin molded body 10 is formed such that one end of the first lead electrode 20 and the second lead electrode 30 protrude from two opposing sides of the rectangle in a plan view. Further, the resin molded body 10 is formed such that the first lead electrode 20 and the second lead electrode 30 are interposed between the other two sides of the rectangle in a plan view. Thus, the resin molded body 10 fixes the first lead electrode 20 and the second lead electrode 30, as being spaced apart from each other, to the bottom surface 10c of the recess 10a.

Further, at an outer surface 11a of the resin molded body 10, a gate mark 50 is molded. The gate mark 50 is a protrusion resulting from a cutting step being the secondary work, and is a remainder of a resin molded body (gate) molded at an injection port portion when resin is injected from the injection port of the mold. Herein, since the cross-sectional shape of an injection port 77, which will be described below, is semicircular, the gate mark 50 is formed as a column having a semicircular cross section. That is, the shape of the gate mark 50 is molded in accordance with the cross-sectional shape of the injection port.

The height, length, and width of the resin molded body 10 are not particularly limited, and can be selected as appropriate in accordance with the purpose and the intended use. The material of the resin molded body 10 may be, for example, thermoplastic resin or thermosetting resin. The thermoplastic resin may be, for example, polyphthalamide resin, liquid crystal polymer, polybutylene terephthalate (PBT), unsaturated polyester or the like. The thermosetting resin may be, for example, epoxy resin, modified epoxy resin, silicone resin, modified silicone resin or the like.

The recess 10a has a lateral surface 10b and a bottom surface 10c, and has a shape of a frustum of a cone in which the width is narrowed toward the bottom surface 10c. The light emitted by the light emitting element 2 is reflected by the lateral surface 10b. The light can be condensed or diffused by changing the angle of the lateral surface 10b as appropriate. The bottom surface 10c is made up of the first lead electrode 20, the second lead electrode 30, and a gap 10e that is part of the resin molded body 10. The gap 10e is provided between the first lead electrode 20 and the second lead electrode 30 such that the first lead electrode 20 and the second lead electrode 30 are not short-circuited.

In order for the lateral surface 10b of the recess 10a to efficiently reflect light, the resin molded body 10 may contain a light reflective member. The light reflective member is a material exhibiting high light reflectivity, such as white filler of titanium oxide, glass filler, silica, alumina, zinc oxide or the like. A visible light reflectivity of 70% or more, preferably 80% or more is preferable. In particular, a reflectivity of 70% or more or 80% or more in the wavelength band of light emitted by the light emitting element is preferable. The compounded amount of titanium oxide or the like may be in a range of 5 weight % to 50 weight %, and preferably in a range of 10 weight % to 30 weight %. However, the present invention is not limited thereto.

The first lead electrode 20 includes a first inner lead portion 20a and a first outer lead portion 20b.

The first inner lead portion 20a refers to a lead portion positioned inside and under the resin molded body 10 in a plan view. The shape of the first inner lead portion 20a is approximately a quadrangle in a plan view. However, the shape thereof is not limited thereto, and the first inner lead portion 20a may be partially provided with a cutout, a recess, a projection or the like.

The first outer lead portion 20b refers to a lead portion positioned outside the resin molded body 10 in a plan view. The shape of the first outer lead portion 20b is a quadrangle in a plan view. However, the shape thereof is not limited thereto, and the first outer lead portion 20b may be partially provided with a cutout, a recess, a projection or the like.

The second lead electrode 30 includes a second inner lead portion 30a and a second outer lead portion 30b.

The second inner lead portion 30a refers to a lead portion positioned inside and under the resin molded body 10 in a plan view. The shape of the second inner lead portion 30a is approximately a quadrangle in a plan view. However, the shape thereof is not limited thereto, and the second inner lead portion 30a may be partially provided with a cutout, a recess, a projection or the like.

The second outer lead portion 30b refers to a lead portion positioned outside the resin molded body 10 in a plan view. The shape of the second outer lead portion 30b is a quadrangle in a plan view. However, the shape thereof is not limited thereto, and the second outer lead portion 30b may be partially provided with a cutout, a recess, a projection or the like.

The first lead electrode 20 and the second lead electrode 30 are formed to be exposed outside the resin molded body 10 at the bottom surface of the package 90. The outer bottom surface of the package 90 is the surface to be mounted on an external substrate. The first lead electrode 20 and the second lead electrode 30 are arranged as being spaced apart from each other by the gap 10e of the resin molded body 10, and used as the anode electrode and the cathode electrode when the light emitting device is in use.

Note that, herein, though the second lead electrode 30 is formed to be longer than the first lead electrode 20, the length, width, and thickness of the first lead electrode 20 and the second lead electrode 30 are not particularly limited, and can be selected as appropriate in accordance with the purpose and the intended use. The first lead electrode 20 and the second lead electrode 30 are formed using electrically conductive material such as iron, copper, phosphor bronze, copper alloy or the like. Further, in order to enhance reflectivity of light from the light emitting element 2, the first lead electrode 20 and the second lead electrode 30 are metal-plated with gold, silver, copper, aluminum or the like.

The first lead electrode 20 has a front surface protrusion 4, which is a protrusion linearly formed along the resin molded body 10 at the bottom surface 10c of the recess 10a, and along its periphery at the bottom surface 10c of the recess 10a. That is, the first lead electrode 20 is provided with the front surface protrusion 4 at the boundary between a portion subjected to wire bonding and the resin molded body 10.

Specifically, part of the front surface protrusion 4 is formed along the lateral surface of the resin molded body 10 structuring the lateral surface 10b of the recess 10a, and another part thereof is formed along the gap 10e connecting the first lead electrode 20 and the second lead electrode 30.

Further, the lateral surface 10b of the recess 10a is connected continuously to an outer corner portion of the front surface protrusion 4. That is, in a cross-sectional view, the lower portion of the lateral surface 10b of the recess 10a is in contact with the position of the outer corner portion of the front surface protrusion 4, such that the upper surface of the front surface protrusion 4 and the lateral surface 10b of the recess 10a are continuous to each other. Further, the lowermost surface connecting to the lateral surface 10b of the recess 10a and the upper surface of the front surface protrusions 4 and 5 may be on an identical plane. Even when an upper mold part 70 and the pair of lead electrodes 20 and 30 are misaligned, the bottom surface 10c of the recess 10a can be easily formed.

Further, the first lead electrode 20 has a back surface protrusion 6, which is a protrusion formed at the position on the back surface opposite to the position of the front surface protrusion 4. That is, the back surface protrusion 6 is formed on the back surface of the first lead electrode 20 along the position where the front surface protrusion 4 is formed.

The second lead electrode 30 has a front surface protrusion 5, which is a protrusion linearly formed along the resin molded body 10 at the bottom surface 10c of the recess 10a, and along its periphery at the bottom surface 10c of the recess 10a. That is, the second lead electrode 30 is provided with the front surface protrusion 5 at the boundary between a portion where the light emitting element 2 is bonded by die bonding and the resin molded body 10.

Specifically, part of the front surface protrusion 5 is formed along the lateral surface of the resin molded body 10 structuring the lateral surface 10b of the recess 10a, and another part thereof is formed along the gap 10e connecting the first lead electrode 20 and the second lead electrode 30.

Further, the lateral surface 10b of the recess 10a is connected continuously to an outer corner portion of the front surface protrusion 5. That is, in a cross-sectional view, the lower portion of the lateral surface 10b of the recess 10a is in contact with the position of the outer corner portion of the front surface protrusion 5, such that the upper surface of the front surface protrusion 5 and the lateral surface 10b of the recess 10a are continuous to each other.

Further, the second lead electrode 30 has a back surface protrusion 7, which is a protrusion formed at the position on the back surface opposite to the position of the front surface protrusion 5. That is, the back surface protrusion 7 is formed on the back surface of the second lead electrode 30 along the position where the front surface protrusion 5 is formed.

Herein, the front surface protrusion 5 is annularly formed so as to surround the region for mounting the light emitting element 2. The region for mounting the light emitting element 2 specifically refers to the region in the second inner lead portion 30a exposed at the bottom surface 10c of the recess 10a (hereinafter referred to as the "light emitting element mounting region").

The front surface protrusions 4 and 5 and the back surface protrusions 6 and 7 can be formed by subjecting the base material itself of the metal plates to work. In the present embodiment, the material of the pair of lead electrodes 20 and 30 and the material of the front surface protrusions 4 and 5 and the back surface protrusions 6 and 7 are identical, and the front surface protrusions 4 and 5 and the back surface protrusions 6 and 7 are integrally formed with the pair of lead electrodes 20 and 30.

The surface of the pair of lead electrodes 20 and 30 is covered by the plating layer 60. Note that, as used herein, the surface of the pair of lead electrodes 20 and 30 refers to the upper surface and the back surface of each of the pair of lead electrodes 20 and 30. However, in the present embodiment, the plating layer 60 is formed also at each lateral surface of the first lead electrode 20 and the second lead electrode 30 where the first lead electrode 20 and the second lead electrode 30 are opposed to each other. Then, the respective tips of the front surface protrusions 4 and 5 and the back surface protrusions 6 and 7 are exposed outside the plating layer 60. That is, at the upper surface of the front surface protrusions 4 and 5 and the lower surface of the back surface protrusions 6 and 7, the plating layer 60 is not provided, and the metal plates are exposed. In this manner, in the present embodiment, the pair of lead electrodes 20 and 30 are provided with the plating layer 60 except for at the outer lateral surface of the first lead electrode 20 and the outer lateral surface of the second lead electrode 30, the upper surface of the front surface protrusions 4 and 5 and the lower surface of the back surface protrusions 6 and 7.

A width A1 of each of the front surface protrusions 4 and 5 is preferably 110 μm or more. By setting the width A1 of the front surface protrusions 4 and 5 to 110 μm or more, the front surface protrusions 4 and 5 can be easily formed. Further, in manufacturing the light emitting device 1, when the width A1 of the front surface protrusions 4 and 5 is 110 μm or more, and resin is injected into the mold, provided that the resin flows onto the upper surface of the front surface protrusions 4 and 5, the resin tends to stop midway on the upper surface of the front surface protrusions 4 and 5. Accordingly, the resin will not easily flow to reach the metal exposed portions on the first lead electrode 20 and the second lead electrode 30, and the effect of suppressing a production of resin burrs is enhanced. In order to more easily achieve the above-described effects, the width A1 of the front surface protrusions 4 and 5 is more preferably 130 μm or more and further preferably 150 μm or more.

Note that, the metal exposed portion on the first lead electrode 20 is the portion on the first lead electrode 20 at the bottom surface 10c of the recess 10a excluding the front surface protrusion 4, and the metal exposed portion on the second lead electrode 30 is the portion on the second lead electrode 30 at the bottom surface 10c of the recess 10a excluding the front surface protrusion 5.

Further, the width A1 of the front surface protrusions 4 and 5 is preferably 200 μm or less. In manufacturing the light emitting device 1, when the width A1 of the front surface protrusions 4 and 5 is 200 μm or less, the pressing force is more easily centered to the front surface protrusions 4 and 5 when the pair of lead electrodes 20 and 30 are pressed by the mold. In order to more easily achieve the above-described effect, the width A1 of the front surface protrusions 4 and 5 is more preferably 180 μm or less, and further preferably 150 μm or less.

Note that, the width A1 of the front surface protrusions 4 and 5 is the width excluding the thickness of the plating layer 60. Further, as will be described below, the thickness of metal portions 14 formed by the front surface protrusions 4 and 5 being crushed is not included. This is also applicable to the width A2 of each of the back surface protrusions 6 and 7.

A thickness B1 of each of the front surface protrusions 4 and 5 is preferably from 5 μm to 50 μm inclusive. In manufacturing the light emitting device 1, when the thickness B1 of the front surface protrusions 4 and 5 is 5 μm or more, as will be described below, and the pair of lead electrodes 20 and 30 are pressed by the mold, the possibility of the upper mold part being brought into contact with the metal exposed portions on the first lead electrode 20 and the second lead electrode 30 becomes smaller. On the other hand, when the thickness B1 of the front surface protrusions 4 and 5 is 50 μm or less, the thickness of the entire pair of lead electrodes 20 and 30 can be reduced. In order to more easily achieve the effect described above, the thickness B1 of the front surface protrusions 4 and 5 is more preferably 10 μm or more, and further preferably 15 μm or more. Further, in order to further easily achieve the above-described effect, the thickness B1 of the front surface protrusions 4 and 5 is more preferably 45 μm or less, and further preferably 40 μm or less.

Note that, the thickness B1 of the front surface protrusions 4 and 5 in the light emitting device 1 is the thickness of the front surface protrusions 4 and 5 after the package 90 is manufactured, and the thickness from which the thickness of the plating layer 60 is removed. This is also applicable to the thickness B2 of each of the back surface protrusions 6 and 7.

A width A2 of each of the back surface protrusions 6 and 7 is preferably 110 μm or more. By setting the width A2 of the back surface protrusions 6 and 7 to 110 μm or more, the back surface protrusions 6 and 7 can be easily formed. Further, by setting the width A2 of the back surface protrusions 6 and 7 to 110 μm or more, when the light emitting device 1 is mounted on an external substrate, since the back surface protrusions 6 and 7 are in contact with the mounting surface of the substrate over a wide area, excellent heat dissipation can be realized. Furthermore, in mounting the light emitting device 1, the bonding member becomes less likely to enter between the first lead electrode 20 and the second lead electrode 30. In order to more easily achieve the above-described effect, the width A2 of the back surface protrusions 6 and 7 is more preferably 130 μm or more, and further preferably 150 μm or more.

Further, the width A2 of the back surface protrusions 6 and 7 is preferably 200 μm or less. In manufacturing the light emitting device 1, when the width A2 of the back surface protrusions 6 and 7 is 200 μm or less, and the pair of lead electrodes 20 and 30 are pressed by the mold, the pressing force will be more easily centered to the back surface protrusions 6 and 7. In order to more easily achieve the above-described effect, the width A2 of the back surface protrusions 6 and 7 is more preferably 180 μm or less, and further preferably 150 μm or less.

A thickness B2 of each of the back surface protrusions 6 and 7 is preferably from 5 μm to 50 μm inclusive. In manufacturing the light emitting device 1, when the thickness B2 of the back surface protrusions 6 and 7 is 5 μm or more, as will be described later, and the pair of lead electrodes 20 and 30 are pressed by the mold, the possibility of the lower mold part being brought into contact with the pair of lead electrodes 20 and 30 becomes smaller. Further, in mounting the light emitting device 1, the bonding member becomes less likely to enter between the first lead electrode 20 and the second lead electrode 30. On the other hand, when the thickness B2 of the back surface protrusions 6 and 7 is 50 μm or less, the thickness of the entire pair of lead electrodes 20 and 30 can be reduced. In order to more easily achieve the above-described effect, the thickness B2 of the back surface protrusions 6 and 7 is more preferably 10 μm or more, and further preferably 15 μm or more. Further, in order to more easily achieve the above-described effect, the thickness B2 of the back surface protrusions 6 and 7 is preferably 45 μm or less, and further preferably 40 μm or less.

Note that, the width and thickness of the front surface protrusions 4 and 5 and the back surface protrusions 6 and 7 are changed as appropriate depending on the material of the first lead electrode 20 and the second lead electrode 30, the size of the resin molded body and the like.

The light emitting element 2 is mounted on the second lead electrode 30 of the package 90. The shape or size of the light emitting element 2 used herein is not particularly limited. As to the color of light emitted by the light emitting element 2, an arbitrary wavelength can be selected in accordance with the intended use. For example, as a light emitting element of blue (wavelength 430 nm to 490 nm), GaN-base or InGaN-base may be employed. The InGaN-base may be $In_XAl_YGa_{1-X-Y}N$ ($0 \leq X \leq 1$, $0 \leq Y \leq 1$, $X+Y<1$) or the like.

The wires W are electrically conductive wires for electrically connecting the light emitting element 2 and electrical components such as a protective element to the first lead electrode 20 and the second lead electrode 30. The material of the wires W may be metal such as Au (gold), Ag (silver), Cu (copper), Pt (platinum), Al (aluminum) or the like, and alloy thereof. Particularly, Au being excellent in thermal conductivity and the like is preferable. Note that, the thickness of the wire W is not particularly limited, and can be selected as appropriate in accordance with the purpose and the intended use.

The sealing member 40 is provided in the recess 10a of the package 90 so as to cover the light emitting element 2 and the like. The sealing member 40 is provided for protecting the light emitting element 2 and the like from an external force, dust, moisture and the like, and to improve the heat resistance, weather resistance, and lightfastness of the light emitting element 2 and the like. The material of the sealing member 40 may be thermosetting resin, e.g., a transparent material such as silicone resin, epoxy resin, urea resin or the like. In addition to such a material, for obtaining a prescribed function, a fluorescent material or filler of a substance exhibiting high light reflectivity may be added to the sealing member 40.

For example, by mixing the sealing member 40 and a fluorescent material, color-tone adjustment of the light emitting device 1 can be easily achieved. Note that, such a fluorescent material may be the one greater in specific gravity than the sealing member 40, and absorbing the light from the light emitting element 2 to convert the wavelength. When the fluorescent material is greater in specific gravity than the sealing member 40, it precipitates toward the first lead electrode 20 and the second lead electrode 30 and therefore it is preferable. Specifically, for example, a yellow fluorescent material such as YAG ($Y_3Al_5O_{12}$:Ce), silicate or the like, a red fluorescent material such as CASN (CaAlSiN$_3$:Eu) or KSF ($K_2SiF_6$:Mn) or the like, or a green fluorescent material such as chlorosilicate, $BaSiO_4$:$Eu^{2+}$ or the like may be used.

As the filler contained in the sealing member 40, for example a substance exhibiting high light reflectivity such as $SiO_2$, $TiO_2$, $Al_2O_3$, $ZrO_2$, MgO or the like may be suitably used. Further, for the purpose of cutting undesired wavelengths, for example, an inorganic or organic coloring dye or coloring pigment may be used.

Method of Manufacturing a Light Emitting Device

Figure 6:
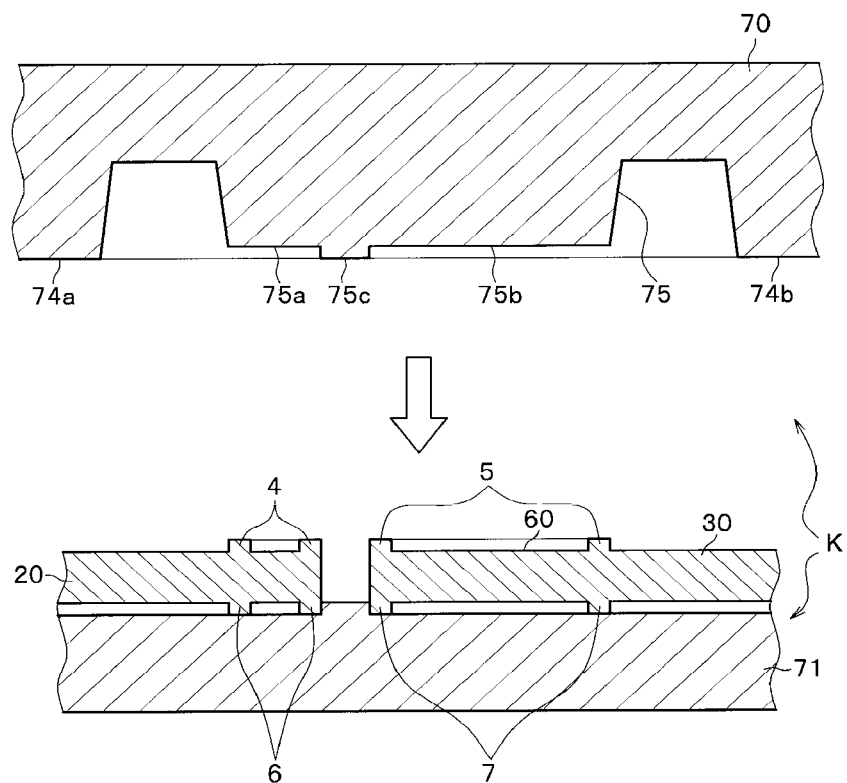
FIG. 6 is a schematic diagram showing an arrangement of lead electrodes and the mold at the position corresponding to line II-II in FIG. 1 in a step of manufacturing the light emitting device according to one embodiment.
Figure 7:
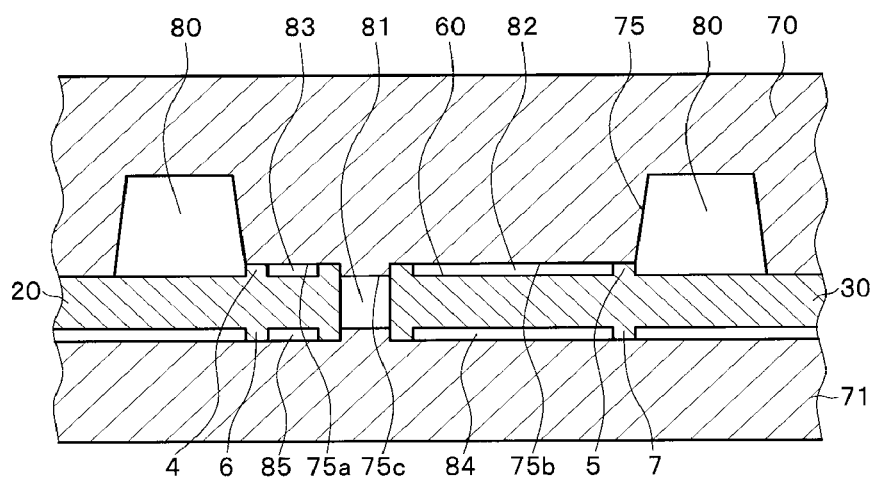
FIG. 7 is a schematic diagram of a cross-section showing the lead electrodes placed between and held by the upper mold part and the lower mold part, in a step of manufacturing a package for mounting a light emitting element according to one embodiment.
Figure 8:
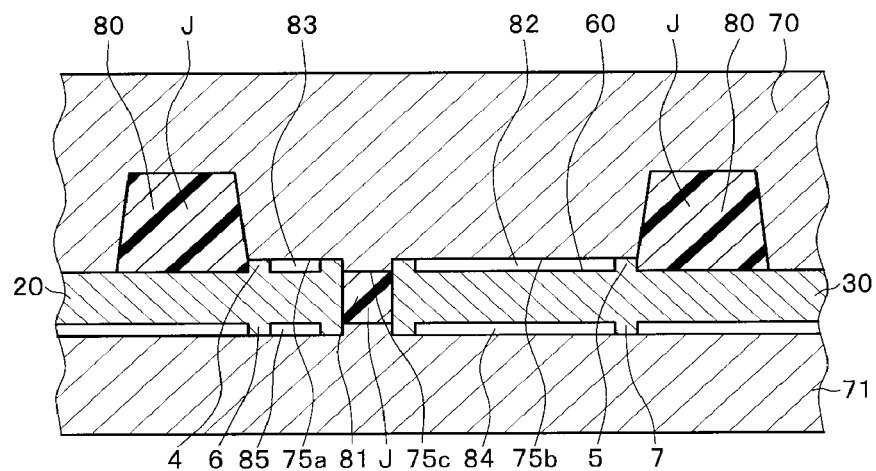
FIG. 8 is a schematic diagram of a cross-section showing a state in which resin is injected and hardened, in a step of manufacturing a package for mounting a light emitting element according to the second embodiment.
Figure 9:
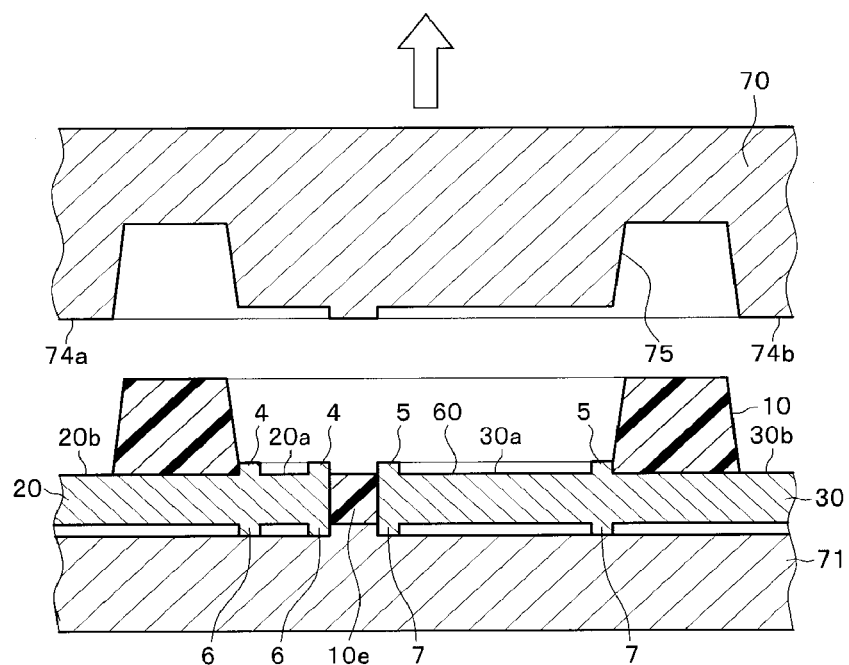
FIG. 9 is a schematic diagram of a cross-section showing removing the upper mold part, in a step of manufacturing a package for mounting a light emitting element according to the second embodiment
Figure 10:
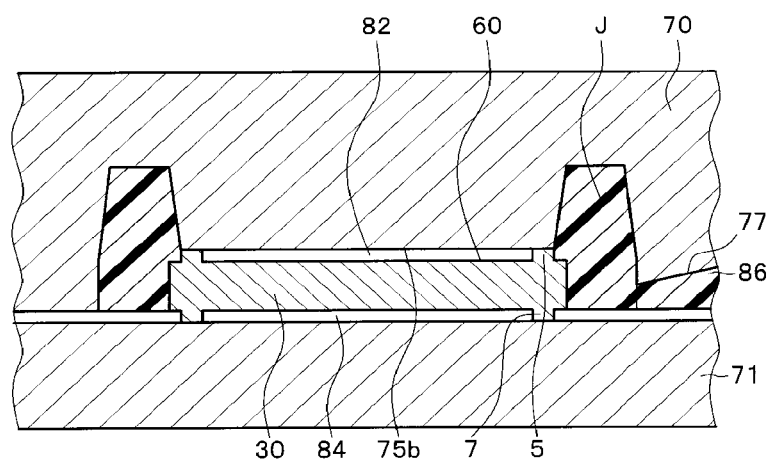
FIG. 10 is a schematic diagram of a cross-section showing a state in which resin is injected and hardened at the position corresponding to line X-X in FIG. 1 in a step of manufacturing the light emitting device according to the second embodiment.
Figure 11:
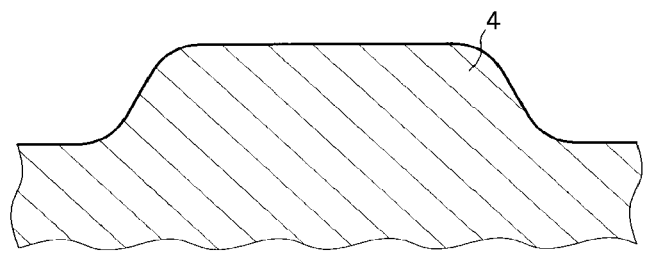
FIG. 11 is a schematic diagram of a cross-section showing a surface protrusion formed by etching in the light emitting device according to one embodiment.
Figure 12:
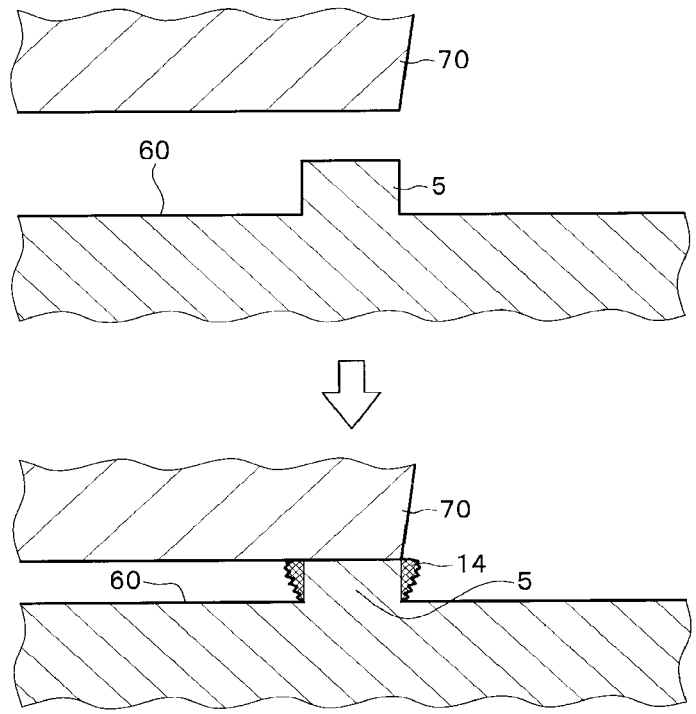
FIG. 12 is a schematic cross-sectional view showing the state of the surface protrusion before and after placed between and pressed by the mold, in a package according to one embodiment.
Figure 13:
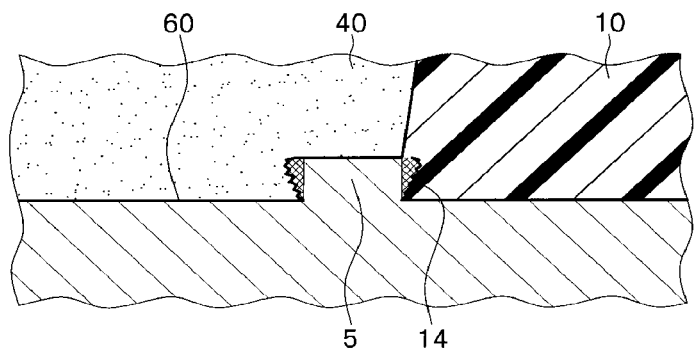
FIG. 13 is a schematic cross-sectional view showing a relationship between the surface protrusion provided with a metal portion and a sealing member in the light emitting device according to one embodiment.

Next, a description will be given of a method of manufacturing the light emitting device according to the present embodiment. FIG. 6 is a schematic diagram showing an arrangement of lead electrodes and the mold at the position corresponding to line II-II in FIG. 1 in a step of manufacturing the light emitting device according to one embodiment. FIG. 7 is a schematic diagram of a cross-section showing the lead electrodes placed between and held by the upper mold part and the lower mold part, in a step of manufacturing a package for mounting a light emitting element according to one embodiment. FIG. 8 is a schematic diagram of a cross-section showing a state in which resin is injected and hardened, in a step of manufacturing a package for mounting a light emitting element according to the second embodiment. FIG. 9 is a schematic diagram of a cross-section showing removing the upper mold part, in a step of manufacturing a package for mounting a light emitting element according to the second embodiment FIG. 10 is a schematic diagram of a cross-section showing a state in which resin is injected and hardened at the position corresponding to line X-X in FIG. 1 in a step of manufacturing the light emitting device according to the second embodiment. FIG. 11 is a schematic diagram of a cross-section showing a surface protrusion formed by etching in the light emitting device according to one embodiment. FIG. 12 is a schematic cross-sectional view showing the state of the surface protrusion before and after placed between and pressed by the mold, in a package according to one embodiment. FIG. 13 is a schematic cross-sectional view showing a relationship between the surface protrusion provided with a metal portion and a sealing member in the light emitting device according to one embodiment.

While not shown herein, a lead frame is used in which a plurality of pairs of metal plates each being the pair of the first lead electrode 20 and the second lead electrode 30 are connected by suspension leads. Further, the pair of metal plates on the lead frame are referred to as the first lead electrode 20 and the second lead electrode 30.

The method of manufacturing the light emitting device 1 according to the present embodiment includes, as one example, the following first to eleventh steps.

The first step is a step of preparing the first lead electrode 20 and the second lead electrode 30.

The structure of the first lead electrode 20 and the second lead electrode 30 are as described above, and the front surface protrusions 4 and 5 and the back surface protrusions 6 and 7 are previously formed.

The front surface protrusions 4 and 5 and the back surface protrusions 6 and 7 can be formed by subjecting the base material itself of the metal plates to work such as, for example, etching or pressing.

When the front surface protrusions 4 and 5 and the back surface protrusions 6 and 7 are formed by etching, the pair of lead electrodes 20 and 30 are covered by a mask of a prescribed shape, and immersed in etchant. Therefore, the lateral surface of the front surface protrusions 4 and 5 and the back surface protrusions 6 and 7 becomes slightly rounded (see FIG. 11). On the other hand, when the front surface protrusions 4 and 5 and the back surface protrusions 6 and 7 are formed by pressing, the lateral surface of the front surface protrusions 4 and 5 and the back surface protrusions 6 and 7 become perpendicular and provided with corners (see FIG. 3).

Further, the front surface protrusions 4 and 5 and the back surface protrusions 6 and 7 crush when pressed by the mold, depending on the pressing pressure. Therefore, the thickness of the front surface protrusions 4 and 5 and the back surface protrusions 6 and 7 is preferably designed such that thicknesses B1 and B2 of the front surface protrusions 4 and 5 and the back surface protrusions 6 and 7 become 5 μm to 50 μm inclusive when pressed, taking into consideration the pressing pressure.

The second step is a step of forming the plating layer 60 on the surface of the pair of lead electrodes 20 and 30 such that at least the tips of the front surface protrusions 4 and 5 and the back surface protrusions 6 and 7 are exposed. The place where the plating layer 60 is formed is as described above.

The plating layer 60 can be formed by electroless plating or electroplating. Further, in order to allow the tips of the front surface protrusions 4 and 5 and the back surface protrusions 6 and 7 to be exposed outside the plating layer 60, for example, a mask may be used, or the plating layer 60 at the tips of the front surface protrusions 4 and 5 and the back surface protrusions 6 and 7 may be removed by etching after formation of the plating layer 60. The method of electroless plating or electroplating is not particularly limited, and should be performed according to any conventional method.

Then, before performing the third step, as shown in FIG. 6, the first lead electrode 20 and the second lead electrode 30 are arranged between the upper mold part 70 and the lower mold part 71. The first lead electrode 20 and the second lead electrode 30 are arranged as spaced apart by the gap 10e (see FIG. 2) for preventing short-circuiting. At this time, the lower mold part 71 abuts the tip of the back surface protrusion 7 of the second lead electrode 30, and the lower mold part 71 abuts the tip of the back surface protrusion 6 of the first lead electrode 20. Note that, the upper mold part 70 has a projection 75 corresponding to the shape of the recess 10a, in order to form the recess 10a for storing the light emitting element 2 by the pair of lead electrodes 20 and 30 and the resin molded body 10.

The third step is a step of, for example, using a package-manufacturing purpose mold K, pressing the pair of lead electrodes 20 and 30 so as to allow the exposed tips of the front surface protrusions 4 and 5 to abut the upper mold part 70, and allow the exposed tips of the back surface protrusions 6 and 7 to abut the lower mold part 71. Here, as shown in FIG. 7, the first lead electrode 20 and the second lead electrode 30 are pressed between the upper mold part 70 and the lower mold part 71.

Specifically, a second outer portion 74b of the upper mold part 70 abuts the portion corresponding to the second outer lead portion 30b of the second lead electrode 30, and a second bottom surface 75b formed at the projection 75 of the upper mold part 70 abuts the front surface protrusion 5 of the second lead electrode 30. Further, a first outer portion 74a of the upper mold part 70 abuts the portion corresponding to the first outer lead portion 20b of the first lead electrode 20, and a first bottom surface 75a formed at the projection 75 of the upper mold part 70 abuts the front surface protrusion 4 of the first lead electrode 20. Thus, by the upper mold part 70 and the lower mold part 71, space portions 80 and 81 are formed.

A third bottom surface 75c formed at the projection 75 of the upper mold part is formed in a projecting manner between the first bottom surface 75a and the second bottom surface 75b. This is to avoid formation of a clearance between the first lead electrode 20 and the second lead electrode 30.

However, it is also possible that the projection 75 of the upper mold part 70 is formed flat, and the first bottom surface 75a, the second bottom surface 75b, and the third bottom surface 75c are flush with one another. In this case, the front surface protrusion 4 of the first lead electrode 20, the front surface protrusion 5 of the second lead electrode 30, and the gap 10e are on an identical plane and flush with one another. Further, in addition to the lower mold part 71, the gap 10e corresponding to the area between the back surface protrusion 6 of the first lead electrode 20 and the back surface protrusion 7 of the second lead electrode 30 may be flat, and the upper surface of the lower mold part 71 may be flush. In this case, the back surface protrusion 6 of the first lead electrode 20, the back surface protrusion 7 of the second lead electrode 30, and the gap 10e are on an identical plane and flush with one another.

In the third step, the first lead electrode 20 and the second lead electrode 30 are pressed by the mold by a pressing force with which contact between the second bottom surface 75b formed at the projection 75 of the upper mold part 70 and the metal exposed portion of the second lead electrode 30 is avoided, and contact between the first bottom surface 75a and the metal exposed portion of the first lead electrode 20 is avoided. At this time, though the front surface protrusions 4 and 5 crush when being pressed depending on the pressing pressure, the second bottom surface 75b does not abut the metal exposed portion of the second lead electrode 30, and hence, a space portion 82 is formed. Similarly, since the first bottom surface 75a does not abut the metal exposed portion of the first lead electrode 20, a space portion 83 is formed.

Further, though the back surface protrusions 6 and 7 crush when being pressed depending on the pressing pressure, the lower mold part 71 does not abut the metal exposed portion of the second lead electrode 30, and hence, a space portion 85 is formed. Similarly, with the lower mold part 71, since the first bottom surface 75a does not abut the metal exposed portion of the first lead electrode 20, a space portion 84 is formed. Note that, the metal exposed portions at the back surface of the pair of lead electrodes 20 and 30 are the portions at the back surface of the pair of lead electrodes 20 and 30 excluding the back surface protrusions 6 and 7.

In the third step, preferably, pressing is performed such that the thicknesses B1 and B2 of the front surface protrusions 4 and 5 and the back surface protrusions 6 and 7 in the manufactured light emitting device 1 becomes 5 µm to 50 µm inclusive.

The fourth step is a step of injecting a resin J into the package-manufacturing purpose mold K pressing the pair of lead electrodes 20 and 30. Herein, as shown in FIGS. 7 and 8, the resin J is injected into the space portions 80 and 81 formed by the upper mold part 70 and the lower mold part 71 from the injection port 77 by transfer molding. In the fourth step, since the first lead electrode 20 and the second lead electrode 30 are pressed by the upper mold part 70 and the lower mold part 71, the first lead electrode 20 and the second lead electrode 30 do not flap when the resin J is injected. Thus, production of burrs can be suppressed. Note that, since the pair of lead electrodes 20 and 30 are provided with the front surface protrusions 4 and 5 and the back surface protrusions 6 and 7, the resin J is less prone to enter the space portions 82, 83, 84, and 85.

The fifth step is a step of forming the resin molded body 10 by curing the resin J injected into the package-manufacturing purpose mold K. Herein, when thermosetting resin such as epoxy resin is injected as the resin J, for example, the upper mold part 70 and the lower mold part 71 are heated to thereby heat the resin J for a prescribed period, to allow the resin J to cure. Note that, when thermoplastic resin such as polyphthalamide resin, for example, is injected, molding can be achieved through injection molding. In this case, the thermoplastic resin may be melted under high temperatures, put into a low-temperature mold and allowed to cure by being cooled.

The sixth step is a step of removing the upper mold part 70 and the lower mold part 71. Herein, for example, as shown in FIG. 9, the upper mold part 70 is removed. Thus, the package in which the first lead electrode 20 and the second lead electrode 30 are integrally retained by the resin molded body 10 is completed.

Note that, when the resin J is cured in the fifth step, in a cross section including the injection port 77 of the upper mold part 70, i.e., in a cross section taken along line X-X in FIG. 1, as shown in FIG. 10, a gate 86 is molded at the injection port 77 portion. The gate 86 is cut by a known cutting machine along the outer surface 11a of the resin molded body 10 after the upper mold part 70 is removed (the seventh step). Thus, the gate mark 50 is formed as the mark remaining when the gate 86 is cut off.

The eighth step is a step of mounting the light emitting element 2 in the recess 10a formed at the package 90. In the present embodiment, the light emitting element 2 is an element having the one-surface electrode structure in which a pair of n-electrode and p-electrode are formed on the upper surface. In this case, the back surface of the light emitting element 2 is bonded to the second lead electrode 30 by an insulating die-bonding member. One electrode on the upper surface of the light emitting element 2 is connected to the first lead electrode 20 by the wire W, and the other electrode on the upper surface of the light emitting element 2 is connected to the second lead electrode 30 by the wire W.

The ninth step is a step of packing the sealing member 40 into the recess 10a of the package 90 so as to cover the light emitting element 2. Here, as shown in FIG. 2, the sealing member 40 is applied inside the recess 10a surrounded by the resin molded body 10 of the package 90, to thereby seal the light emitting element 2. At this time, the sealing member 40 is dripped to reach the upper surface of the recess 10a of the resin molded body 10. The sealing member 40 may be packed into the recess 10a of the resin molded body 10 by, for example, injection, compression, or extrusion. It is preferable that a fluorescent material is previously mixed with the sealing member 40. Thus, the color of the light emitting device can be adjusted easily.

The tenth step is a step of curing the sealing member 40 packed into the recess 10a. Here, when thermosetting resin such as silicone resin, for example, is injected as the sealing member 40, the resin is heated for a prescribed period and cured.

The eleventh step is a step of cutting off the package 90 from the lead frame. Herein, the resin molded body 10 and the pair of lead electrodes 20 and 30 are cut off from the lead frame, whereby the package 90 is singulated. Here, as a jig for cutting the suspension leads of the lead frame, for example, a lead cutter may be used.

Through the foregoing steps, the light emitting device 1 can be formed.

As has been described in the foregoing, with the method of manufacturing the package according to the present embodiment, as shown in FIGS. 7 and 8, the first lead electrode 20 and the second lead electrode 30 are pressed by the upper mold part 70 and the lower mold part 71. When the resin J is injected, the pressed area is smaller than that in the case where the front surface protrusions 4 and 5 and the back surface protrusions 6 and 7 do not exist at the lead electrodes. Accordingly, the pressing force is centered at the front surface protrusions 4 and 5 and the back surface protrusions 6 and 7, and the upper mold part 70 and the lower mold part 71 are brought into intimate contact with the first lead electrode 20 and the second lead electrode 30. Further, since the front surface protrusions 4 and 5 and the back surface protrusions 6 and 7 are provided at the same position on the front and back surfaces of the first lead electrode 20 and the second lead electrode 30, the pressing force becomes more prone to be centered at the front surface protrusions 4 and 5 and the back surface protrusions 6 and 7. Further, since the plating layer 60 is not formed at the tips of the front surface protrusions 4 and 5 and the back surface protrusions 6 and 7, the pressing force becomes more prone to be centered at the front surface protrusions 4 and 5 and the back surface protrusions 6 and 7.

Accordingly, the resin J will not easily flow into the space portions 82 and 83, that is, onto the metal exposed portions on the first lead electrode 20 and the second lead electrode 30. Thus, with the package and the light emitting device according to the embodiment, production of burrs can be suppressed.

Accordingly, a step of removing burrs of the bottom surface 10c of the recess 10a, which is otherwise conventionally required after the step of molding the package, can be eliminated. Therefore, according to the methods of manufacturing the package and the light emitting device according to the embodiment, the package and the light emitting device with which production of burrs can be suppressed can be manufactured easily. As a result, a reduction in costs and lead time can be achieved.

Furthermore, the resin J will not easily flow into the space portions 84 and 85. Thus, with the package and the light emitting device according to the embodiment, a step of removing burrs at the back surface of the package can be eliminated.

In addition, as in the conventional case where the front surface protrusions 4 and 5 do not exist at the lead electrodes, when the lead frame is pressed by the mold, marks resulting from the work using the mold remain, and the degree of a shine of the surface of the plating layer 60 on the first lead electrode 20 and the second lead electrode 30 is changed by the pressing pressure and heat of the mold. Accordingly, even when the degree of a shine of the surface of the plating layer 60 on the first lead electrode 20 and the second lead electrode 30 is increased before molding, the degree of a shine is reduced after molding. Then, the luminous flux of the LED is reduced, and the output is also reduced.

However, since the front surface protrusions 4 and 5 exist at the first lead electrode 20 and the second lead electrode 30 according to the embodiment of the invention, the first bottom surface 75a and the second bottom surface 75b formed at the projection 75 of the upper mold part 70 will not be brought into contact with the metal exposed portions of the first lead electrode 20 and the second lead electrode 30. Therefore, molding can be achieved without reducing the degree of a shine of the plating of the first lead electrode 20 and the second lead electrode 30. Thus, the conventional problem of a reduction in the output of the LED can be solved.

Further, since the front surface protrusions 4 and 5 and the back surface protrusions 6 and 7 exist at the first lead electrode 20 and the second lead electrode 30, the area pressed by the mold is smaller than that in the conventional case. Since the pressing pressure is centered at the front surface protrusions 4 and 5 and the back surface protrusions 6 and 7, the number of LEDs that can be manufactured from one lead frame can be increased.

Still further, since the pressing pressure is centered only at the front surface protrusions 4 and 5 and the back surface protrusions 6 and 7, the pressing pressure of the package-manufacturing purpose mold K itself can be reduced, for example, to about half as great as that of the conventional mold. As a result, the effect of an increase in the life of the mold apparatus can also be attained.

Still further, since the front surface protrusions 4 and 5 are formed at the first lead electrode 20 and the second lead electrode 30, the contact area relative to the sealing member 40 increases, whereby adhesion to the sealing member 40 improves. Still further, as shown in FIG. 12, since the front surface protrusions 4 and 5 and the back surface protrusions 6 and 7 crush when being pressed, part of the metal of the front surface protrusions 4 and 5 and the back surface protrusions 6 and 7 squeezes out in the lateral direction, to form a metal portion 14. As shown in FIG. 13, by the sealing member 40 entering below the metal portion 14, the sealing member 40 is prevented from coming off upward. Note that, the annular shape of the front surface protrusions 4 and 5 also contributes to preventing the sealing member 40 from coming off.

Still further, since the package 90 is molded without reducing the degree of a shine of the surface of the plating layer 60 on the first lead electrode 20 and the second lead electrode 30 exposed at the recess 10a, a reduction in the luminous flux of the light emitting device 1 can be suppressed, and a reduction in the output can be prevented.

Still further, since the front surface protrusions 4 and 5 exist at the first lead electrode 20 and the second lead electrode 30, flow-out (bleeding) of the die-bonding member in mounting the light emitting element 2 can be suppressed. In particular, when a plurality of light emitting elements 2 are mounted, flow-out of the die-bonding member in the lateral direction becomes a concern. However, when the width A1 of the front surface protrusions 4 and 5 is 110 μm or more, the die-bonding member will not easily flow over the front surface protrusions 4 and 5.

Still further, since the back surface protrusions 6 and 7 exist at the first lead electrode 20 and the second lead electrode 30, in mounting the light emitting device 1, a bonding member such as solder paste or the like can be injected into the regions surrounded by the back surface protrusions 6 and 7. Thus, bonding strength can be improved. Further, leakage of the bonding member in the lateral direction is prevented, whereby short-circuiting caused by the bonding member entering between the first lead electrode 20 and the second lead electrode 30 is prevented. When the width A2 of the back surface protrusions 6 and 7 is 110 μm or more, the bonding member will not easily flow over the back surface protrusions 6 and 7. Further, by setting the thickness of the back surface protrusions 6 and 7 to an identical value, stability in mounting the light emitting device 1 improves.

EXAMPLE

Example 1

In the following, Example 1 of the present invention will be described. Molding was performed using, as shown in FIGS. 2 and 3, the first lead electrode 20 and the second lead electrode 30 provided with the front surface protrusions 4 and 5 at the boundary between the metal exposed portions of the first lead electrode 20 and the second lead electrode 30 and the resin molded body 10, and with the back surface protrusions 6 and 7 at the position on the back surface opposite to the position of the front surface protrusions 4 and 5, using a transfer molding machine.

The molding was performed under the conventional pressing pressure and injection pressure conditions with which resin burrs were produced when molding was performed using conventional lead electrodes without the front surface protrusions 4 and 5 and the back surface protrusions 6 and 7. Then, whether or not burrs were produced was checked.

As a result, it was found that burrs were not produced at the metal exposed portions of the first lead electrode 20 and the second lead electrode 30, with the first lead electrode 20 and the second lead electrode 30 provided with the front surface protrusions 4 and 5 and the back surface protrusions 6 and 7. Further, it was found that burrs were not produced at the back surface of the first lead electrode 20 and the second lead electrode 30.

Still further, it was found that the second bottom surface 75b formed at the projection 75 of the upper mold part 70 was not brought into contact with the metal exposed portion of the second lead electrode 30 exposed at the recess 10a of the package 90. This metal exposed portion is the central portion of the second inner lead portion 30a excluding the front surface protrusion 5.

Still further, it was found that the first bottom surface 75a formed at the projection 75 of the upper mold part 70 was not brought into contact with the metal exposed portion of the first lead electrode 20 exposed at the recess 10a of the package 90. This metal exposed portion is the central portion of the first inner lead portion 20a excluding the front surface protrusion 4.

VARIATIONS

Next, a description will be given of Variations of the light emitting device according to the present embodiment.

Variation 1

Figure 14:
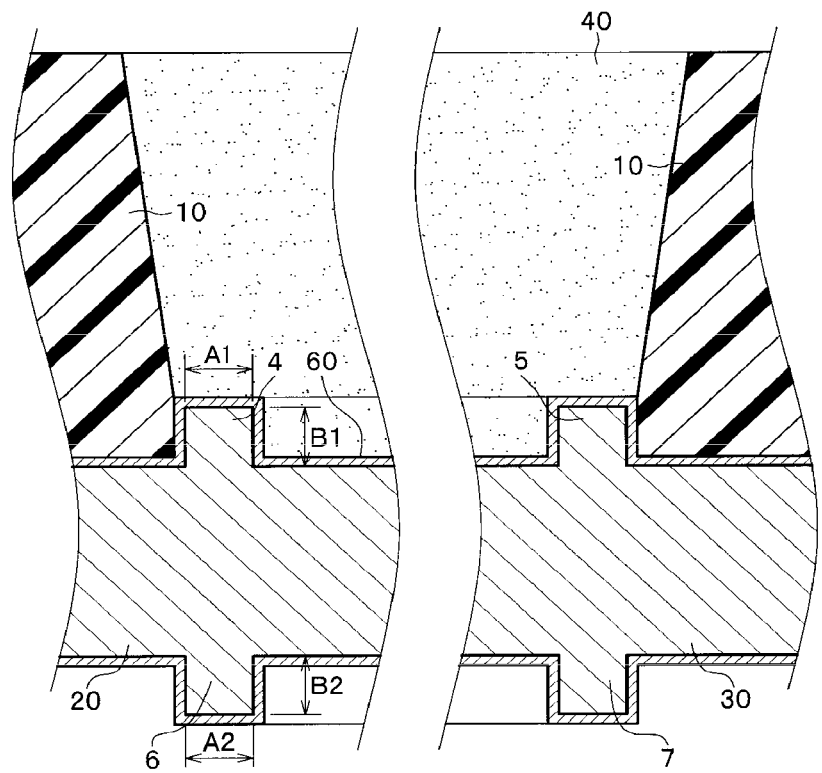
FIG. 14 is a partial schematic diagram of a cross-section showing a state of a plating layer, in a step of manufacturing the light emitting device according to Variation 1.

FIG. 14 is a partial schematic diagram of a cross-section showing a state of a plating layer, in a step of manufacturing the light emitting device according to Variation 1.

In the embodiment described above, the tips of the front surface protrusions 4 and 5 and the back surface protrusions 6 and 7 are exposed outside the plating layer 60. On the other hand, in Variation 1, the tips of the front surface protrusions 4 and 5 and the back surface protrusions 6 and 7 are covered by the plating layer 60. Furthermore, in the embodiment described above, the widths A1 and A2 of the front surface protrusions 4 and 5 and the back surface protrusions 6 and 7 are preferably 110 μm or more. On the other hand, in Variation 1, the width A1 and A2 of the front surface protrusions 4 and 5 and the back surface protrusions 6 and 7 must be 110 μm or more. Other configurations are similar to that in the embodiment described above.

With such a structure, except that the tips of the front surface protrusions 4 and 5 and the back surface protrusions 6 and 7 are exposed outside the plating layer 60, the effect achieved by provision of the front surface protrusions 4 and 5 and the back surface protrusions 6 and 7, and the effect achieved by the widths A1 and A2 of the front surface protrusions 4 and 5 and the back surface protrusions 6 and 7 being 110 μm or more can be obtained.

Further, in a method of manufacturing the package according to Variation 1, in the second step, the tips of the front surface protrusions 4 and 5 and the back surface protrusions 6 and 7 are covered by the plating layer 60.

Variation 2

Figure 15:
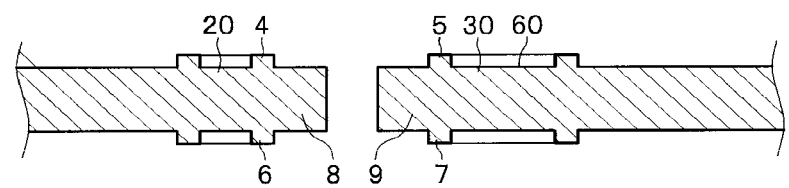
FIG. 15 is a schematic diagram of a cross-section of lead electrodes provided with lateral surface protrusion portions respectively according to Variation 2.
Figure 16:
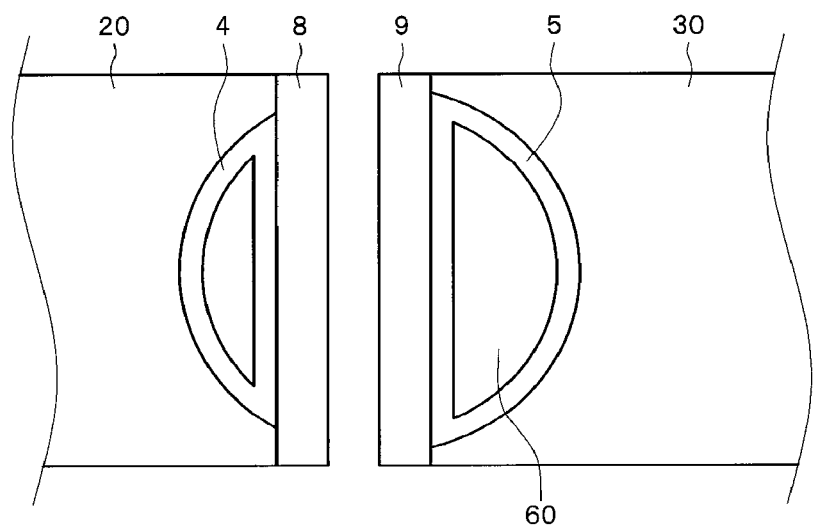
FIG. 16 is a schematic diagram of a top view of lead electrodes provided with lateral surface protrusion portions respectively according to Variation 2.

FIG. 15 is a schematic diagram of a cross-section of lead electrodes provided with lateral surface protrusion portions respectively according to Variation 2. FIG. 16 is a schematic diagram of a top view of lead electrodes provided with lateral surface protrusion portions respectively according to Variation 2.

The first lead electrode 20 and the second lead electrode 30 may be respectively provided with lateral surface protrusions 8 and 9 being protrusions formed in the width direction of respective lateral surfaces opposing each other, at the center in the height direction of the lateral surfaces. That is, the first lead electrode 20 and the second lead electrode 30 respectively have the lateral surface protrusions 8 and 9 protruding in the horizontal direction at the sites where the pair of lead electrodes 20 and 30 are connected by the resin molded body 10.

The lateral surface protrusion 8 of the first lead electrode 20 is formed by a prescribed thickness at the center in the height direction in a cross-sectional view. Further, in a top view, the lateral surface protrusion 8 of the first lead electrode 20 is formed in the width direction of the first lead electrode 20, that is, in parallel with the longitudinal direction of the gap 10e connecting the first lead electrode 20 and the second lead electrode 30, in the entire width direction of the first lead electrode 20.

The lateral surface protrusion 9 of the second lead electrode is formed by a prescribed thickness at the center in the height direction in a cross-sectional view. Further, in a top view, the lateral surface protrusion 9 of the second lead electrode 30 is formed in the width direction of the second lead electrode 30, that is, in parallel with the longitudinal direction of the gap 10e connecting the first lead electrode 20 and the second lead electrode 30, in the entire width direction of the second lead electrode 30.

The lateral surface protrusions 8 and 9 can be formed in the first lead electrode 20 and the second lead electrode 30, for example, by subjecting the base material itself of the metal plates, for example, to work of etching or pressing.

By provision of the lateral surface protrusions 8 and 9, with the package 90, adhesion between the first lead electrode 20 and the second lead electrode 30 and the resin molded body 10 improves, and the first lead electrode 20 and the second lead electrode 30 are more firmly fixed to each other. Note that, the thicknesses and lengths of the lateral surface protrusions 8 and 9 are not particularly limited, and should be adjusted as appropriate.

Variation 3

Figure 17:
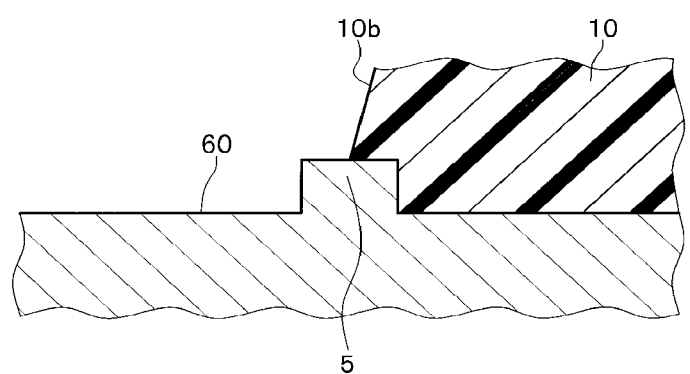
FIG. 17 is a schematic cross-sectional view showing a positional relationship between a front surface protrusion and a resin molded body of a light emitting device according to Variation 3.
Figure 18:
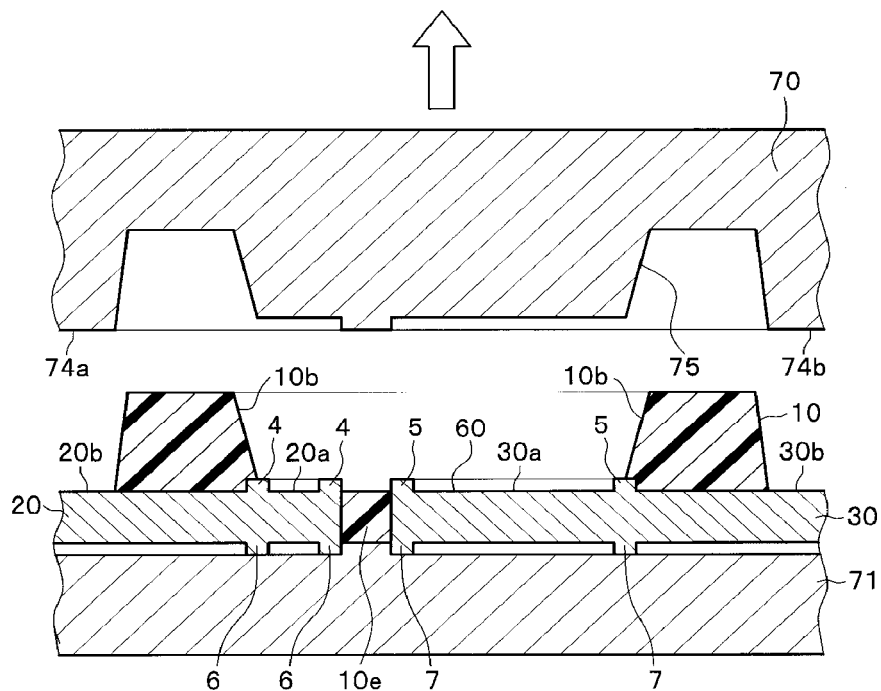
FIG. 18 is a schematic cross-sectional view showing a positional relationship between the front surface protrusion and the resin molded body and a mold of the light emitting device according to Variation 3.

FIG. 17 is a schematic cross-sectional view showing a positional relationship between a front surface protrusion and a resin molded body of a light emitting device according to Variation 3. FIG. 18 is a schematic cross-sectional view showing a positional relationship between the front surface protrusion and the resin molded body and a mold of the light emitting device according to Variation 3.

The lateral surface 10b of the recess 10a is on the front surface protrusions 4 and 5, and may be connected continuously to the upper surface of the front surface protrusions 4 and 5. That is, in the package 90, part of the front surface protrusions 4 and 5 is covered by the resin molded body 10. In a cross-sectional view, the lower part of the lateral surface 10b of the recess 10a is in contact with the position of the upper surface front surface protrusions 4 and 5, and the upper surface of the front surface protrusions 4 and 5 and the lateral surface 10b of the recess 10a are continuously connected.

With such a structure, adhesion of the resin molded body 10 to the pair of lead electrodes 20 and 30 can be more improved.

In the method of manufacturing the package, in a step of pressing the first lead electrode 20 and the second lead electrode 30 by the mold, the first lead electrode 20 and the second lead electrode 30 are pressed such that the outer circumferential end of the projection 75 of the upper mold part 70 is arranged at a prescribed position at the upper surface of the front surface protrusions 4 and 5.

When the first lead electrode 20 and the second lead electrode 30 are pressed by the mold, at the upper surface of the front surface protrusions 4 and 5, the upper mold part 70 and the pair of lead electrodes 20 and 30 may fail to be precisely set because of thermal expansion of the lead electrodes attributed to the heat of the mold, variations in the dimension of the lead electrodes and the like. Accordingly, when the width of the front surface protrusions 4 and 5 is narrow, the outer circumferential end of the projection 75 of the upper mold part 70 may not be arranged at a prescribed position at the upper surface of the front surface protrusions 4 and 5. However, by setting the width of the front surface protrusions 4 and 5 to 110 µm or more, the outer circumferential end of the projection 75 of the upper mold part 70 can be arranged at a prescribed position of the upper surface of the front surface protrusions 4 and 5, and the lateral surface 10b of the recess 10a can be arranged on the front surface protrusions 4 and 5.

Note that, it is preferable that the width of the front surface protrusions 4 and 5 exposed outside the resin molded body 10 becomes 110 µm or more.

Variation 4

Figure 19:
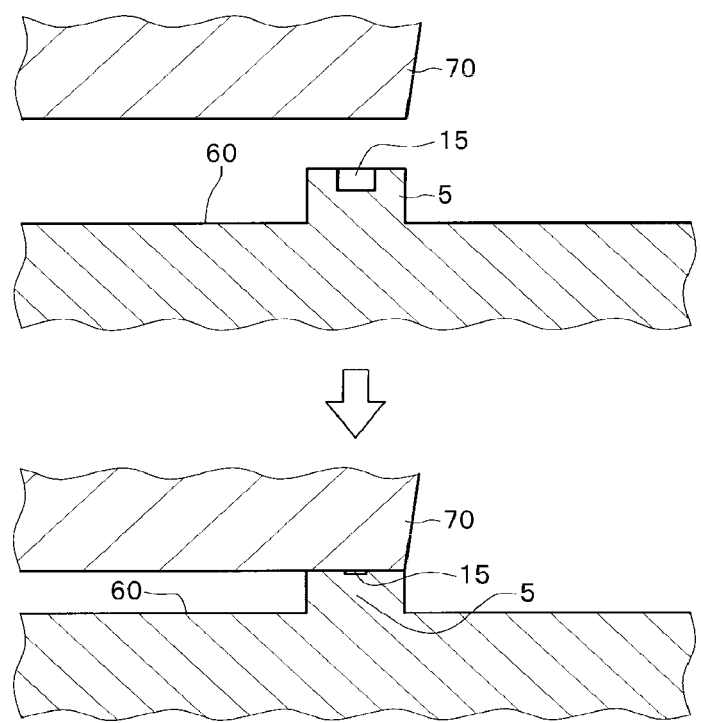
FIG. 19 is a schematic cross-sectional view of a front protrusion provided with a groove, showing a state before and after placed between and pressed by the mold according to Variation 4.

FIG. 19 is a schematic cross-sectional view of a front protrusion provided with a groove, showing a state before and after placed between and pressed by the mold according to Variation 4.

The light emitting device may have a groove portion 15 formed along the longitudinal direction of the front surface protrusions 4 and 5 (i.e., the direction perpendicular to the surface of FIG. 19, and the direction extending along the periphery of the bottom surface 10c of the recess 10a) at the tip of each of the front surface protrusions 4 and 5, and a groove portion 15 formed along the longitudinal direction of the back surface protrusions 6 and 7 (i.e., the direction corresponding to the longitudinal direction of the front surface protrusions 4 and 5) at the tip of each of the back surface protrusions 6 and 7.

The front surface protrusions 4 and 5 are each provided with the groove portion 15 of prescribed depth and shape formed along the longitudinal direction of the front surface protrusions 4 and 5 at the center in the width direction of the upper surface. Similarly, the back surface protrusions 6 and 7 are each provided with the groove portion 15 of a prescribed depth and shape formed along the longitudinal direction of the back surface protrusions 6 and 7 at the center in the width direction of the lower surface. In each groove portion 15, metal is buried, which metal resulting from the front surface protrusions 4 and 5 and the back surface protrusions 6 and 7 being crushed and squeezed out in the lateral direction when pressing is performed with a pressing force of a magnitude with which the front surface protrusions 4 and 5 and the back surface protrusions 6 and 7 crush.

In such a method of manufacturing the light emitting device, firstly, in the step of preparing the pair of lead electrodes 20 and 30, the groove portion 15 is formed at the tip of each of the front surface protrusions 4 and 5 and the back surface protrusions 6 and 7. Then, when the pair of lead electrodes 20 and 30 are pressed, depending on the pressing pressure, the front surface protrusions 4 and 5 and the back surface protrusions 6 and 7 crush, and part of metal of the front surface protrusions 4 and 5 and the back surface protrusions 6 and 7 squeezes out in the lateral direction. Thus, the squeezed out metal is buried in the groove portion 15, whereby production of the metal portion 14 outside the front surface protrusions 4 and 5 and the back surface protrusions 6 and 7 is prevented. Accordingly, while the groove portion 15 in which metal is buried remains at each of the front surface protrusions 4 and 5 and the back surface protrusions 6 and 7 in the manufactured package, the front surface protrusions 4 and 5 and the back surface protrusions 6 and 7 will not have the metal portion 14.

Accordingly, in the light emitting device, when it is desired to keep the shape of the front surface protrusions 4 and 5 and the back surface protrusions 6 and 7, the groove portion 15 is preferably formed at the tip of each of the front surface protrusions 4 and 5 and the back surface protrusions 6 and 7.

The depth, shape, position to be formed and the like of the groove portion 15 are not limited, and should be adjusted as appropriate. Further, the groove portion 15 may be formed at the front surface protrusions 4 and 5, or the back surface protrusions 6 and 7.

Variation 5

Figure 20:
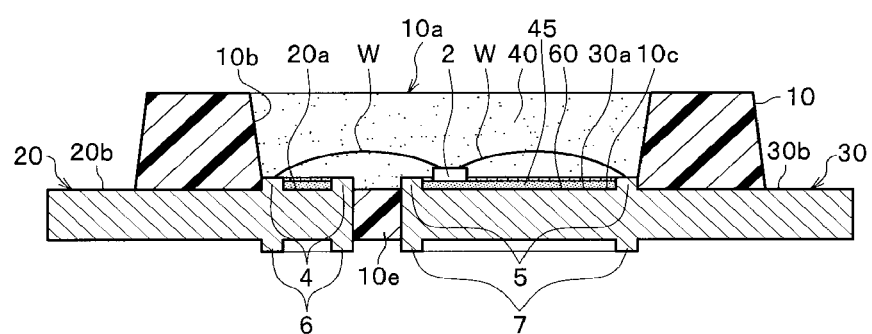
FIG. 20 is a schematic diagram of a cross-section of a light emitting device according to Variation 5 in which a die-bonding member is filled in a region for mounting a light emitting element.

FIG. 20 is a schematic diagram of a cross-section of a light emitting device according to Variation 5 in which a die-bonding member is filled in a region for mounting a light emitting element.

The light emitting device may be structured such that the sealing member 40 contains a first fluorescent material, and resin containing a second fluorescent material being different from the first fluorescent material in the emission wavelength is packed in the region for mounting the light emitting element 2.

For example, as the first fluorescent material, a fluorescent material emitting green-color light is mixed with the sealing member 40. As the second fluorescent material, a fluorescent material emitting red-color light is mixed with a die-bonding member 45. Then, the die-bonding member 45 containing the second fluorescent material is packed in the region for mounting the light emitting element 2 (the metal exposed portion of the second lead electrode 30), and the light emitting element 2 is mounted. Thereafter, the sealing member 40 containing the first fluorescent material is packed in the recess 10a of the package 90, to obtain the light emitting device. Thus, the light emitting device being a bright white-color light source can be obtained. Note that, as shown in FIG. 20, the die-bonding member 45 containing the fluorescent material can also be packed in the metal exposed portion of the first lead electrode 20.

The type and combination of the first fluorescent material and the second fluorescent material should be selected as appropriate as desired.

OTHER VARIATIONS

Though it has been described that the front surface protrusions 4 and 5 and the back surface protrusions 6 and 7 are respectively formed at the first lead electrode 20 and the second lead electrode 30 of the package 90, it is also possible that the front surface protrusion and the back surface protrusion are provided to only one of the lead electrodes.

Further, the lateral surface of the front surface protrusions 4 and 5 on the metal exposed surface side may be inclined outward from bottom to top in a cross section. Such a structure improves the light extracting efficiency.

The recess 10a of the package 90 may be formed into a cylindrical shape without being tilted. Further, the lateral surface 10b of the recess 10a may not necessarily be flat. It is also possible to mold the lateral surface 10b to have an uneven surface, such that the adhesion at the interface between the resin molded body 10 and the sealing member 40 improves. Further, though the recess 10a is molded to be circular in a plan view in the present embodiment, the recess 10a may be molded to be elliptical. Still further, though the resin molded body 10 is molded to be rectangular in the present embodiment, the resin molded body 10 may be molded to have a circular, elliptical, or other polygonal shape in a plan view.

The lead electrodes should be provided, as in the present embodiment, by at least a pair of positive and negative electrodes (the first lead electrode 20 and the second lead electrode 30). However, it is also possible that three or more lead electrodes are provided.

The light emitting element 2 can be mounted on the first lead electrode 20 in place of the second lead electrode 30. When the light emitting device 1 includes, for example two light emitting elements 2, the light emitting elements 2 may be respectively mounted on the first lead electrode 20 and the second lead electrode 30. A protective element may be mounted on the inner lead portion where the light emitting element is not mounted. For example, by setting the width of the front surface protrusions 4 and 5 to 110 μm or more, a protective element can be mounted on the front surface protrusion 4 of the first lead electrode 20 or on the front surface protrusion 5.

The light emitting element 2 may be an element having the opposite electrode structure (the double-surface electrode structure) in which, for example, the n-electrode (or the p-electrode) is formed on the back surface of the element substrate. Further, the light emitting element 2 is not limited to the face-up type, and may be the face-down type. With the light emitting element of the face-down type, the wires can be dispensed with.

In the method of manufacturing the light emitting device 1, the light emitting element 2 is previously mounted on the package 90 and thereafter singulated. However, the light emitting element 2 may be mounted on the singulated package 90.

The position where the wire W is connected may be the upper surface of each of the front surface protrusions 4 and 5. In suspending the wire W, the wire W can be more easily suspended when the height difference between the upper surface of the light emitting element 2 and the position where the wire W is suspended is smaller, that is, when the position where the wire W is suspended is high. Note that, when the width of the front surface protrusions 4 and 5 is 110 μm or more, the wire W is easily connected when the wire W is connected to the upper surface of the front surface protrusions 4 and 5.

When the tips of the front surface protrusions 4 and 5 and the back surface protrusions 6 and 7 are exposed outside the plating layer 60, the plating layer 60 may be provided solely to the upper surface of the pair of lead electrodes 20 and 30.

The light emitting device of the present embodiment is applicable for a backlight light source of a liquid crystal display, various illumination devices, various display apparatuses such as a large-screen display, an advertisement, a destination guide and the like, and furthermore, an image reading apparatus in a digital video camera, a facsimile, a copier, a scanner and the like, a projector apparatus and the like.

As shown in the above descriptions, a package, a light emitting device, and methods of manufacturing the package and the light emitting device in accordance with the representative embodiments have been described herein, but the scope of the invention is not limited to the above description, and should be widely understood based on the scope of the claims. Further, based on the above description, it will be obvious that various changes and modifications can be made therein without departing from the scope of the embodiments of the invention.

What is claimed is:

1. A method of manufacturing a package for mounting a light emitting element, the method comprising:
    providing a pair of lead electrodes, each made of a metal plate, the metal plate of at least one of the lead electrodes having a front surface protrusion and a back surface protrusion, the front surface protrusion being formed in a shape of a circular segment to surround a region for mounting a light emitting element, and the back surface protrusion being formed at a position at a back surface of the metal plate opposite to a position of the front surface protrusion;
    forming a plating layer on a surface of each of the lead electrodes such that at least a tip of each of the front surface protrusion and the back surface protrusion is exposed from the plating layer;
    forming a package comprising the pair of lead electrodes and a resin molded body, the package having a recess, and the step of forming the package comprising:
        providing a mold having an upper mold part and a lower mold part, the upper mold part having a projection with a shape corresponding to the recess,
        placing the first lead electrode and the second lead electrode in predetermined positions on the lower mold part such that the first lead electrode and the second lead electrode are set between the upper mold part and the lower mold part, the exposed tip of the front surface protrusion abuts the upper mold part, and the exposed tip of the back surface protrusion abuts the lower mold part, pressing the upper mold part against the pair of lead electrodes, injecting a resin into the mold, curing the injected resin to form the resin molded body, and separating the upper mold part from the lower mold part.

2. The method of manufacturing a package according to claim 1, wherein the pair of lead electrodes pressed by the upper mold part and the lower mold part are integrally provided in a lead frame in which a plurality of pairs of lead electrodes are connected, and the method further comprises cutting off the package from the lead frame.

3. The method of manufacturing a package according to claim 1, wherein the front surface protrusion has a width of 110 µm or more.

4. The method of manufacturing a package according to claim 1, wherein the front surface protrusion has a width of 200 µm or less.

5. The method of manufacturing a package according to claim 1, wherein the front surface protrusion has a thickness from 5 µm to 50 µm.

6. The method of manufacturing a package according to claim 1, the back surface protrusion has a width of 110 µm or more.

7. The method of manufacturing a package according to claim 1, the back surface protrusion has a width of 200 µm or less.

8. The method of manufacturing a package according to claim 1, wherein the back surface protrusion has a thickness in a range of 5 µm to 50 µm.

9. The method of manufacturing a package according to claim 1, wherein the front surface protrusion and/or the back surface protrusion are forming by etching or pressing.

10. The method of manufacturing a package according to claim 1, wherein the front surface protrusion and/or the back surface protrusion are crushed when pressed by the upper mold part.

11. The method of manufacturing a package according to claim 1, wherein a part of an upper surface of the front surface protrusion is pressed by the upper mold part.

12. The method of manufacturing a package according to claim 1, wherein an upper surface of the front surface protrusion has a groove.

13. A method of manufacturing a light emitting device comprising:

manufacturing a package according to the method of manufacturing a package according to claim 1; and mounting a light emitting element in the recess of the package.

14. The method of manufacturing a light emitting device according to claim 13, further comprising packing a sealing member in the recess so as to cover the light emitting element.

15. A method of manufacturing a package for mounting a light emitting element, the method comprising:

providing a pair of lead electrodes, each made of a metal plate, the metal plate of at least one of the lead electrodes having a front surface protrusion and a back surface protrusion, the front surface protrusion being formed in a shape of a circular segment to surround a region for mounting a light emitting element, and the back surface protrusion being formed at a position at a back surface of the metal plate opposite to a position of the front surface protrusion;

forming a plating layer on a surface of each of the lead electrodes;

forming a package comprising the pair of lead electrodes and a resin molded body, the package having a recess, and the step of forming the package comprising:

providing a mold having an upper mold part and a lower mold part, the upper mold part having a projection with a shape corresponding to the recess, placing the first lead electrode and the second lead electrode in predetermined positions on the lower mold part such that the first lead electrode and the second lead electrode are set between the upper mold part and the lower mold part, the exposed tip of the front surface protrusion abuts the upper mold part, and the exposed tip of the back surface protrusion abuts the lower mold part, pressing the upper mold part against the pair of lead electrodes, injecting a resin into the mold, curing the injected resin to form the resin molded body, and separating the upper mold part from the lower mold part.

16. The method of manufacturing a package according to claim 15, wherein the pair of lead electrodes pressed by the upper mold part and the lower mold part are integrally provided in a lead frame in which a plurality of pairs of lead electrodes are connected, and the method further comprises cutting off the package from the lead frame.

17. A method of manufacturing a light emitting device comprising:

manufacturing a package according to the method of manufacturing a package according to claim 15; and mounting a light emitting element in the recess of the package.

18. The method of manufacturing a light emitting device according to claim 17, further comprising packing a sealing member in the recess so as to cover the light emitting element.

* * * * *